(12) United States Patent
Bailey et al.

(10) Patent No.: US 9,439,328 B2
(45) Date of Patent: Sep. 6, 2016

(54) SYSTEM AND METHOD FOR DIRECTING EXHAUST FROM A MODULAR DATA CENTER

(75) Inventors: Mark Bailey, Burnet, TX (US); Ty Schmitt, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 806 days.

(21) Appl. No.: 13/563,566

(22) Filed: Jul. 31, 2012

(65) Prior Publication Data

US 2014/0038510 A1  Feb. 6, 2014

(51) Int. Cl.
H05K 5/00 (2006.01)
H05K 7/20 (2006.01)

(52) U.S. Cl.
CPC ............................... H05K 7/20745 (2013.01)

(58) Field of Classification Search
CPC ...................... H05K 7/20736; H05K 7/20745
USPC .................................. 454/184, 339; 361/696
See application file for complete search history.

(56) References Cited

U.S. PATENT DOCUMENTS

| | | | | |
|---|---|---|---|---|
| 5,655,963 A * | 8/1997 | Paschke | ................ | F24F 13/068 454/297 |
| 6,280,320 B1 * | 8/2001 | Paschke | .............. | F24F 13/0218 454/296 |
| 7,226,353 B2 * | 6/2007 | Bettridge et al. | ............. | 454/184 |
| 7,486,511 B1 * | 2/2009 | Griffel et al. | ............ | 361/679.46 |
| 7,660,117 B2 * | 2/2010 | Werner et al. | ................ | 361/696 |
| 7,862,410 B2 * | 1/2011 | McMahan | .......... | H05K 7/20736 454/184 |
| 8,009,430 B2 * | 8/2011 | Claassen et al. | ............. | 361/724 |
| 8,072,756 B1 * | 12/2011 | Janes | ................ | H05K 7/20909 361/695 |
| 8,094,450 B2 * | 1/2012 | Cole | ........................ | G07F 9/10 361/695 |
| 8,154,870 B1 * | 4/2012 | Czamara | ........... | H05K 7/20736 361/694 |
| 8,638,553 B1 * | 1/2014 | Czamara et al. | ........ | 361/679.48 |
| 2001/0029163 A1 * | 10/2001 | Spinazzola et al. | .......... | 454/184 |
| 2004/0218355 A1 * | 11/2004 | Bash et al. | ..................... | 361/690 |
| 2004/0229559 A1 * | 11/2004 | Gebke | ................ | F24F 13/0218 454/306 |
| 2005/0170770 A1 * | 8/2005 | Johnson et al. | .............. | 454/184 |
| 2005/0237716 A1 * | 10/2005 | Chu et al. | ...................... | 361/696 |
| 2007/0019380 A1 * | 1/2007 | Campbell et al. | ............. | 361/687 |
| 2009/0052132 A1 * | 2/2009 | Fernandez | ..................... | 361/696 |
| 2009/0239460 A1 * | 9/2009 | Lucia | ................. | H05K 7/20745 454/184 |
| 2010/0216388 A1 * | 8/2010 | Tresh | ................. | H05K 7/20745 454/184 |
| 2010/0252233 A1 * | 10/2010 | Absalom | ............ | H05K 7/20745 165/57 |
| 2011/0175498 A1 * | 7/2011 | Bash et al. | ..................... | 312/107 |
| 2012/0200206 A1 | 8/2012 | Schmitt et al. | | |
| 2012/0200987 A1 | 8/2012 | Schmitt et al. | | |
| 2012/0200992 A1 | 8/2012 | Schmitt et al. | | |
| 2012/0201002 A1 | 8/2012 | Schmitt et al. | | |
| 2012/0212901 A1 | 8/2012 | Schmitt et al. | | |
| 2012/0243175 A1 * | 9/2012 | Okada | ................ | H05K 7/20745 361/690 |
| 2013/0088833 A1 * | 4/2013 | Cox | ................... | H05K 7/20736 361/689 |

* cited by examiner

*Primary Examiner* — Steven B McAllister
*Assistant Examiner* — Jonathan Cotov
(74) *Attorney, Agent, or Firm* — Jackson Walker LLP.

(57) ABSTRACT

In accordance with embodiments of the present disclosure, a modular fluid-handling system may comprise a fluid-handling unit and an exhaust duct coupled to and in fluid communication with the fluid-handling unit. The fluid-handling unit may be configured to exhaust air from an exhaust source in a substantially horizontal direction. The exhaust duct may be configured to redirect air flowing in the substantially horizontal direction from the exhaust source in a substantially vertical direction.

11 Claims, 6 Drawing Sheets

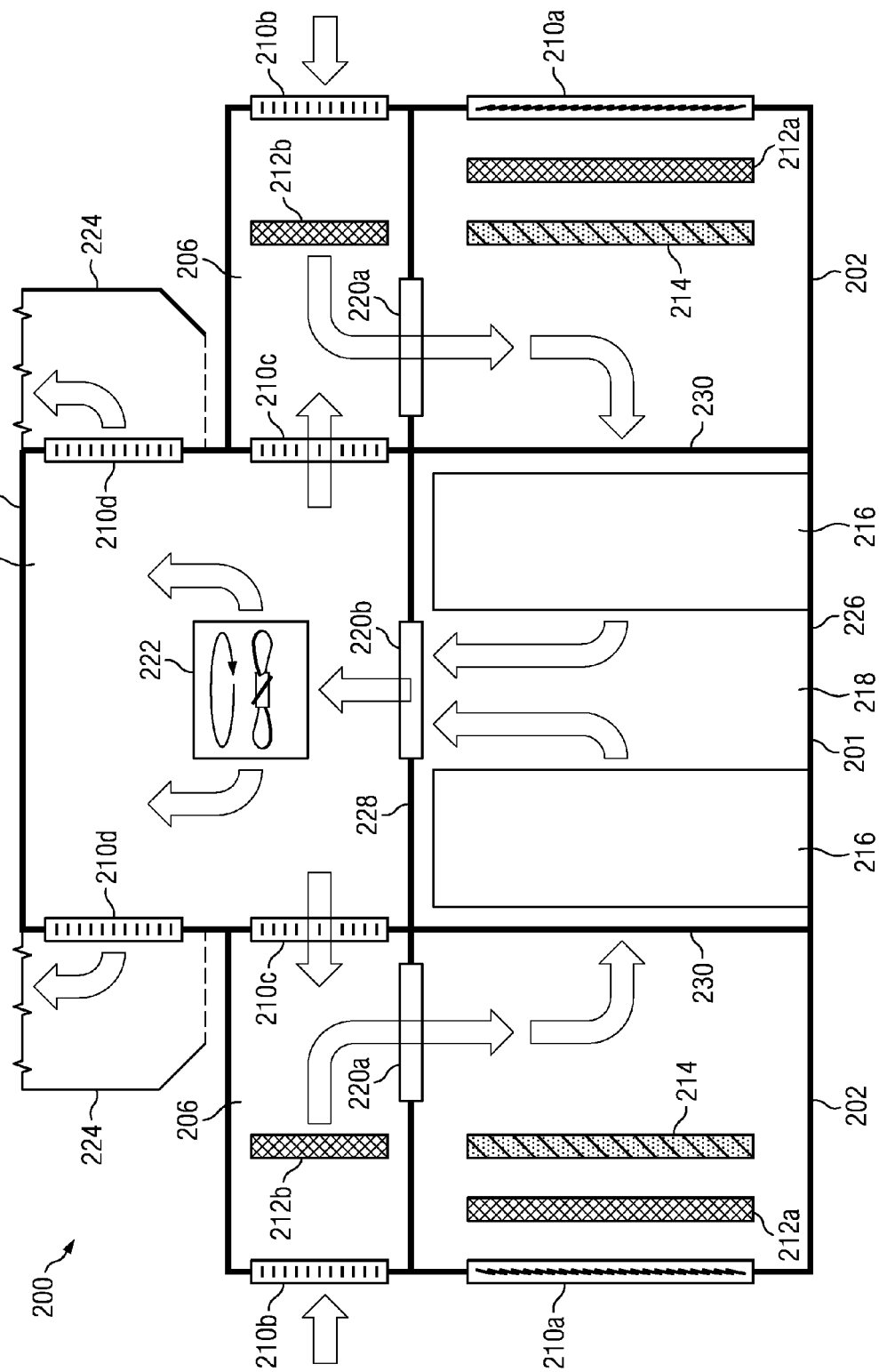

SYSTEM AND METHOD FOR DIRECTING EXHAUST FROM A MODULAR DATA CENTER

TECHNICAL FIELD

The present disclosure relates in general to cooling information handling resources of a modular data center, and more particularly to directing exhaust air from a modular data center.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As the capabilities of information handling systems have improved, the power requirements of information handling systems and their component information handling resources have increased. Accordingly, the amount of heat produced by such information handling resources has increased. Because the electrical properties of information handling resources may be adversely affected by the presence of heat (e.g., heat may damage sensitive information handling resources and/or some information handling resources may not operate correctly outside of a particular range of temperatures), information handling systems often include cooling systems configured to cool such information handling resources.

The construction and configuration of cooling systems may be of particular difficulty in data centers. A data center will typically include multiple information handling systems (e.g., servers), which may be arranged in racks. Each information handling system and its component information handling resources may generate heat, which can adversely affect the various information handling systems and their component information handling resources if not efficiently removed or reduced.

To cool information handling systems in data centers, information handling systems are often cooled via the impingement of air driven by one or more air movers. To effectively control the temperature of information handling resources, especially in installations in which a modular data center is outdoor-exposed (e.g., those placed on building roofs or elsewhere) and 100% outside-air cooled, the modular data center must provide support for extreme temperatures, weather, and airflow ranges.

In addition, it is often critical to exhaust air from the data center after the air has cooled the information handling systems (in the process increasing heat in such air). In outdoor-exposed data centers (e.g., those placed on building roofs or elsewhere outdoors in which a building super structure is not present around the exhaust module in order to act as a chimney or fluid boundary), provisioning for such exhaust may present even greater challenges, as the exhaust module must operate in environmental conditions that may include rains, winds, ice, dust, pollen, snow, and other environmental particulates and must effectively prevent small animals from entering the exhaust module, all the while not impeding air flow from the exhaust and allowing discharge of water and debris from the exhaust module. In addition, another challenge to provisioning of a data center is to reduce or avoid re-entrainment of exhausted air back into the cooling system.

SUMMARY

In accordance with the teachings of the present disclosure, the disadvantages and problems associated with handling exhaust from a data center comprising information handling systems have been substantially reduced or eliminated.

In accordance with embodiments of the present disclosure, a modular fluid-handling system may include an air-handling and mixing unit and a cooling unit. The air-handling and mixing unit may include an air mover plenum and a first mixing plenum. The air mover plenum may have an air mover configured to move air and the air mover plenum may air mover plenum may be configured to be in fluid communication with an outside environment via a first damper and configured to be in fluid communication with a primary structure. The first mixing plenum may be configured to be in fluid communication with the air mover plenum via a second damper and configured to be in fluid communication with the outside environment via a third damper. The first cooling unit may be configured to be in fluid communication with the outside environment via a fourth damper and configured to be in fluid communication with the primary structure and the first mixing plenum. The first damper, the second damper, the third damper, and the fourth damper may be configured to be modulated in response to at least one of environmental conditions present in the primary structure, environmental conditions present in the modular fluid-handling system, and environmental conditions present in the outside environment.

In accordance with these and other embodiments of the present disclosure, a method may include placing a first cooling unit and a second cooling unit symmetrically to each other on either side of a primary structure such that the first cooling unit and the second cooling unit are each in fluid communication with the primary structure, each of the first cooling unit and the second cooling unit in fluid communication with an outside environment via a respective first damper. The method may also include placing an air-handling and mixing unit on top of the primary structure, the first cooling unit, and the second cooling unit, the air-handling and mixing unit having an air mover plenum in fluid communication with the outside environment via at least one second damper and having a first mixing plenum and a second mixing plenum, each of the first mixing plenum and the second mixing plenum in fluid communication with the first cooling unit and the second cooling unit respectively, each of the of the first mixing plenum and the second mixing plenum in fluid communication with the outside environment via a respective third damper and in fluid communication with the air mover plenum via a respective fourth damper. The method may further include modulating the first dampers, at least one second damper, the third dampers, and the fourth dampers to control air flow in at least one of the primary structure, the cooling unit, and the air-handling and mixing unit.

In accordance with these and other embodiments of the present disclosure, an exhaust duct may comprise a top, a bottom, a first vertical side, a second vertical side, and a sloping side. The top may include a first screen. The bottom may be substantially parallel to and opposite from the top, and may include a second screen. The first vertical side may be substantially perpendicular to the top, the first vertical side coupled along a first edge of the first vertical side to a first edge of the top and coupled along a second edge of the first vertical side to a first edge of the bottom. The second vertical side may be substantially parallel to and opposite from the first vertical side, the second vertical side coupled along a first edge of the second vertical side to a second edge of the top and coupled along a second edge of the second vertical side to a second edge of the bottom. The sloping side may be substantially perpendicular to the first vertical side and substantially non-perpendicular and non-parallel to the top, the sloping side coupled along a first edge of the sloping side to a third edge of the first vertical side, coupled along a second edge of the sloping side to a third edge of the second vertical side, and coupled along a third edge of the sloping side to a third edge of the bottom.

In accordance with these and other embodiments of the present disclosure, a modular fluid-handling system may comprise a fluid-handling unit and an exhaust duct coupled to and in fluid communication with the fluid-handling unit. The fluid-handling unit may be configured to exhaust air from an exhaust source in a substantially horizontal direction. The exhaust duct may be configured to redirect air flowing in the substantially horizontal direction from the exhaust source in a substantially vertical direction.

Technical advantages of the present disclosure may be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3C illustrates the modular data center of FIG. 2 operating in a third mode, in accordance with embodiments of the present disclosure.

DETAILED DESCRIPTION

Preferred embodiments and their advantages are best understood by reference to FIGS. 1-4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, an information handling resource may broadly refer to any component system, device or apparatus of an information handling system, including without limitation a processor, bus, memory, input-output device and/or interface, storage resource (e.g., hard disk drives), network interface, electro-mechanical device (e.g., fan), display, power supply, and/or any portion thereof. An information handling resource may comprise any suitable package or form factor, including without limitation an integrated circuit package or a printed circuit board having mounted thereon one or more integrated circuits.

Figure 1:
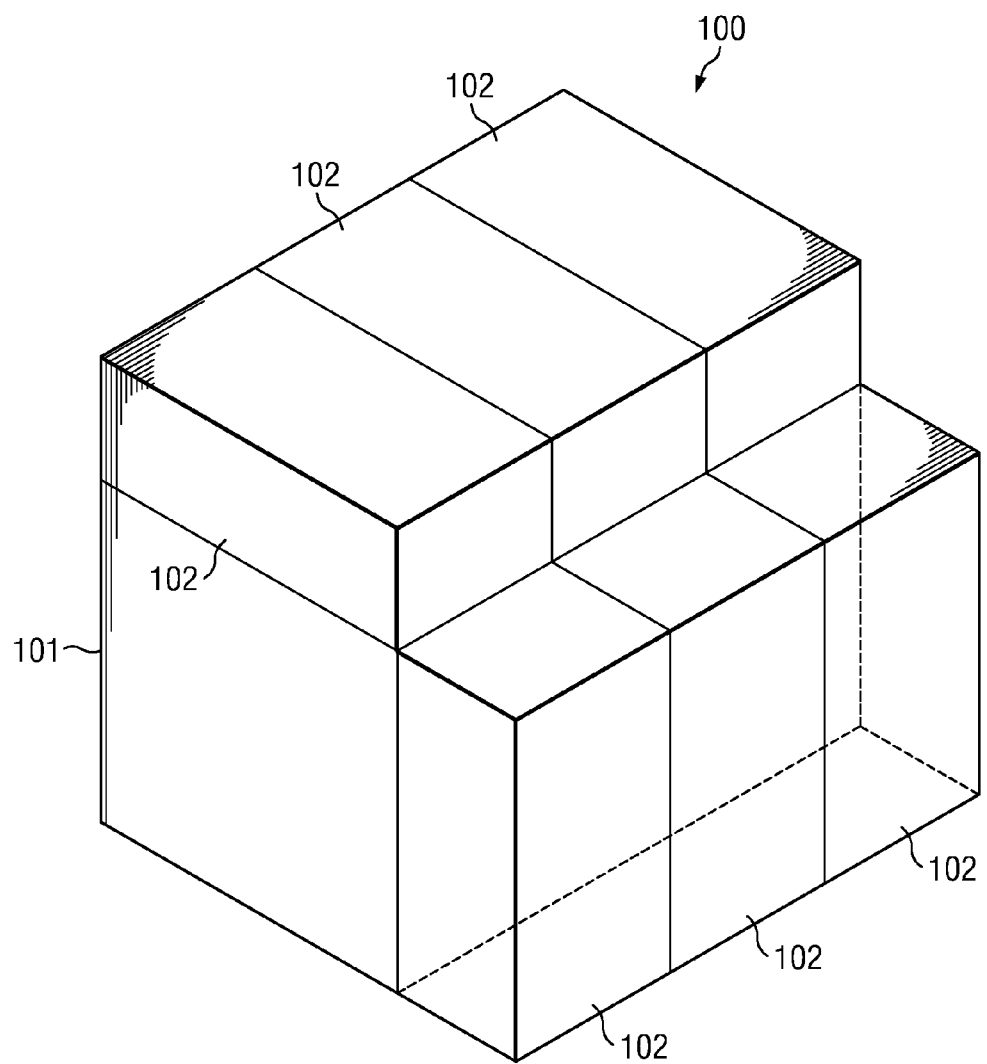
FIG. 1 illustrates an example modular data center incorporating a modular fluid-handling system, in accordance with embodiments of the present disclosure.

FIG. 1 illustrates an example modular data center 100 incorporating a modular fluid-handling system, in accordance with embodiments of the present disclosure. Modular data center 100 may include primary structure 101. Primary structure 101 may include a plurality of information handling systems mounted in racks. Modular data center 100 may also include a modular fluid-handling system comprising one or more fluid-handling units 102 installed adjacent to (e.g., on top of and/or laterally proximate to) primary structure 101. Because of the modular nature of the modular fluid-handling system, the modular fluid-handling system may be installed without affecting the placement of racks within a modular data center, and fluid-handling units 102 making up the modular fluid-handling system may have a plurality of different-sized structural enclosures, modules, and fluid-handling equipment with different functions, and may include a plurality of operating modes, as set forth in greater detail below.

Figure 2:
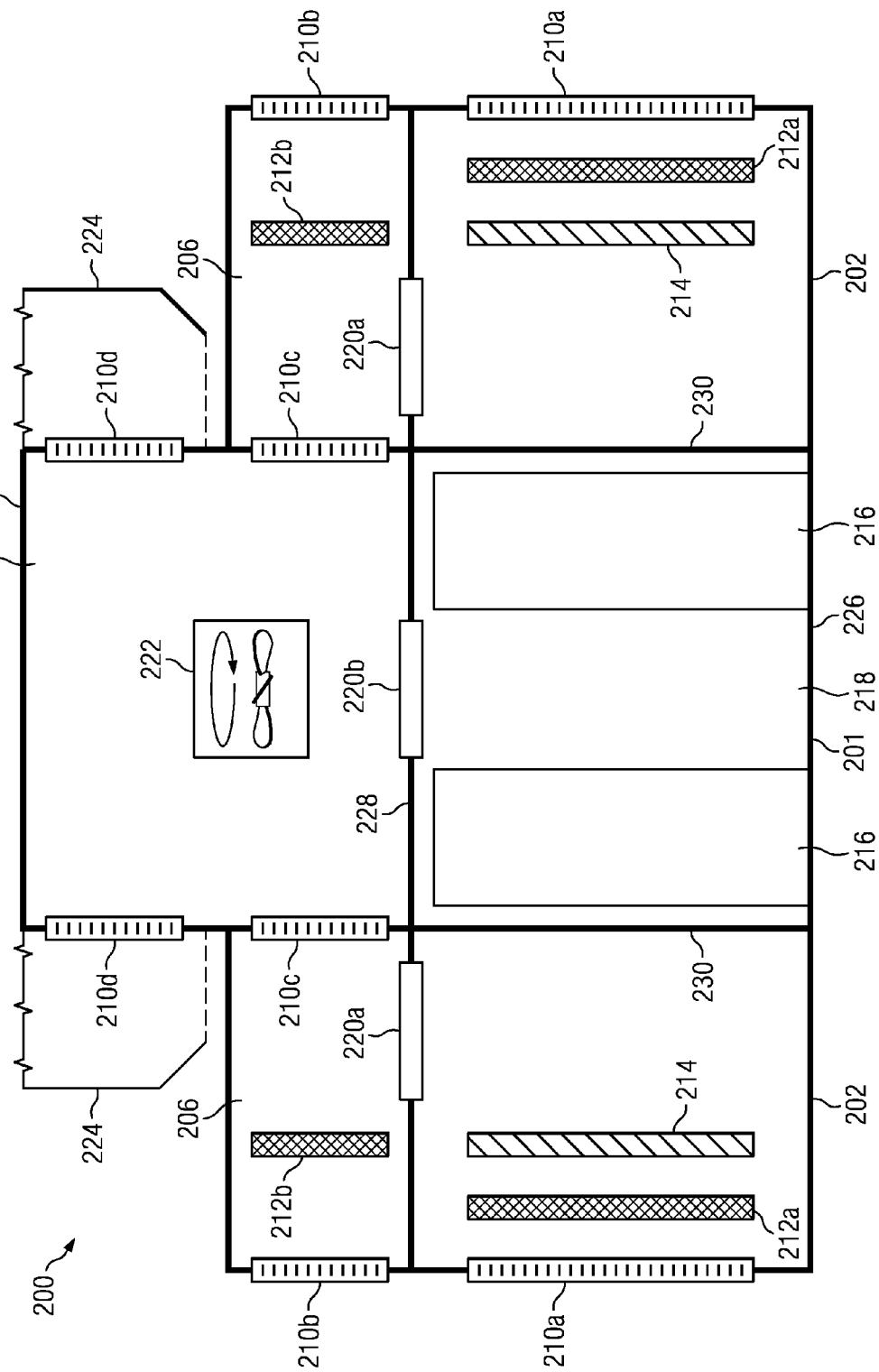
FIG. 2 illustrates a cross section of an example modular data center incorporating an example of a modular fluid-handling system, in accordance with embodiments of the present disclosure.

FIG. 2 illustrates a cross section of an example modular data center 200 incorporating an example of a modular fluid-handling system, in accordance with embodiments of the present disclosure. Modular data center 200 may comprise a primary structure 201, one or more cooling units 202, an air-handling and mixing unit 204, a plurality of apertures 220 (e.g., apertures 220a and 220b), and one or more exhaust ducts 224.

In one or more embodiments of this disclosure, primary structure 201 may comprise an information technology (IT) module. In these embodiments, such IT module may include a plurality of information handling systems as well as racks for holding the information handling systems and the power distribution elements for providing electrical power to each of the information handling systems. As depicted in FIG. 2, primary structure 201 may include a base 226, a top 228, and sides 230. Sides 230 of primary structure 201 may be open, allowing fluid communication between the exterior of sides 230 and the interior of primary structure 201. Primary structure 201 may also include one or more racks 216 which may include one or more information handling systems (e.g., servers). Between racks 216 may be an aisle 218.

Modular data center 200 may also include a fluid-handling system comprising the one or more cooling units 202 and air-handling and mixing unit 204. In one or more embodiments, cooling units 202 may be placed on the sides of primary structure 201. Cooling units 202 may be one of a plurality of fluid-handling units 102 that are placed to the side of primary structure 101, as can be seen, for example, in FIG. 1. Cooling unit 202 may also share at least one dimension in common with primary structure 201 (e.g., height, as shown in FIG. 2). Other embodiments may include cooling units 202 manufactured integrally with primary structure 201, cooling units 202 in a variety of shapes and sizes, as well as cooling units 202 in other locations, such as along top 228 of primary structure 201, or underneath base 226 of primary structure 201. As mentioned above, sides 230 of primary structure 201 may be open, thus allowing fluid communication between each cooling unit 202 and primary structure 201.

As shown in FIG. 2, each cooling unit 202 may include a damper 210a, a filter 212a, and heat-rejection media 214. A damper 210a may include any system, device, or apparatus, (e.g., a valve, plate, or other mechanical structure) configured to modulate the flow of air between components of a fluid-handling system or between a component of a fluid-handling system and the exterior of the fluid-handling system (e.g., between the exterior of cooling unit 202 and interior of cooling unit 202 as shown in FIG. 2). In some embodiments, a damper 210a may comprise an automatic damper operated by one or more motors (e.g., electric or pneumatic motors), which may in turn be controlled by a sensor (e.g., thermostat), automation system, and/or other control system. A damper 210a, when modulated to an open position, may allow air from outside of modular data center 200 to enter a corresponding cooling unit 202.

An air filter 212a may include any system, device, or apparatus configured to remove solid particulates (e.g., dust, pollen, mold, and bacteria), particular chemicals (e.g., volatile organic compounds or ozone), and/or other matter from air passing through it.

Heat-rejection media 214 may include any system, device, or apparatus configured to transfer heat from air passing by it or through it, thus reducing the temperature of the air. For example, heat-rejection media 214 may include an evaporator, coils or other conduits having chilled water, coils or other conduits employing direct-expansion cooling, and/or coils or other conduits employing indirect-expansion cooling.

In one or more embodiments, air-handling and mixing unit 204 may be mounted above primary structure 201 and cooling units 202, as depicted in FIG. 2. Air-handling and mixing unit 204 may be one of a plurality of fluid-handling units 102 that are placed on top of primary structure 101, as can be seen, for example, in FIG. 1. Air-handling and mixing unit 204 may also share at least one dimension in common with the combination of primary structure 201 and the one or more cooling units 202 (e.g., width, as shown in FIG. 2). Other embodiments may include air-handling and mixing unit 204 manufactured integrally with primary structure 201 and/or cooling units 202, air-handling and mixing units 204 in a variety of shapes and sizes, as well as air-handling and mixing unit 204 in other locations, such as along a side 230 of primary structure 201, or underneath base 226 of primary structure 201.

As shown in FIG. 2, air-handling and mixing unit 204 may include one or more mixing plenums 206, an air mover plenum 208, a plurality of dampers 210 (e.g., dampers 210b, 210c, and 210d), one or more filters 212b, and an air mover 222. As shown in FIG. 2, air-handling and mixing unit 204 may in some embodiments include mixing plenums 206 manufactured integrally with air mover plenum 208. However, in other embodiments, mixing plenums 206 and air mover plenums 208 may not be part of the same integral module, and may instead be separate modular components of modular data center 200.

Similar to dampers 210a, any or all of dampers 210b, 210c, and 210d may include any system, device, or apparatus, (e.g., a valve, plate, or other mechanical structure) configured to modulate the flow of air between components of a fluid-handling system or between a component of a fluid-handling system and the exterior of the fluid-handling system (e.g., between the exterior of air-handling and mixing unit 204 and interior of air-handling and mixing unit 204 for dampers 210b and 210d, and between a mixing plenum 206 and air mover plenum 208 for dampers 210c, as shown in FIG. 2). In some embodiments, a damper 210b, 210c, and/or 210d may comprise an automatic damper operated by one or more motors (e.g., electric or pneumatic motors), which may in turn be controlled by a sensor (e.g., thermostat), automation system, and/or other control system. As shown in FIG. 2, in some embodiments of the present disclosure one or more of dampers 210b, 210c, and or 210d may be arranged such that when open, air flows through such dampers in a substantially horizontal direction (e.g., in a direction substantially perpendicular to sides 230 and substantially parallel to base 226 and top 230).

A damper 210b, when modulated to an open position, may allow some air entering air mover plenum 208 from primary structure 201 to flow to mixing plenum 206. A damper 210c, when modulated to an open position, may allow air from outside of modular data center 200 to enter a corresponding mixing plenum 206. A damper 210d may typically be left modulated to an open position so some of air flowing in modular data center 200 may be exhausted to the environment. However, all dampers 210 within modular data center 200 may be modulated to allow a particular amount of air to flow through each in order to precisely control the temperature of air circulating in modular data center 200.

Similar to air filters 212a, an air filter 212b may include any system, device, or apparatus configured to remove solid particulates (e.g., dust, pollen, mold, and bacteria), particular chemicals (e.g., volatile organic compounds or ozone), and/or other matter from air passing through it.

Air mover 222 may include any mechanical or electro-mechanical system, apparatus, or device configured to move air and/or other gasses. In some embodiments, air mover 222 may comprise a fan (e.g., a rotating arrangement of vanes or blades which act on the air). In other embodiments, air mover 222 may comprise a blower (e.g., centrifugal fan that employs rotating impellers to accelerate air received at its intake and change the direction of the airflow). In these and other embodiments, rotating and other moving components of air mover 222 may be driven by a motor (not expressly shown). In one or more embodiments of the present disclosure, air mover 222 may be arranged such that rotational components of air mover 222 rotate about an axis that is substantially vertical (e.g., in an axis substantially parallel to sides 230 and substantially perpendicular to base 226 and top 230). Such an orientation of air mover 222 permits the symmetric modular data center arrangement depicted in FIG. 2, whereby only one air mover 222 is needed to provide for temperature control of two rows of racks 216 on opposite sides of primary structure 201, wherein such temperature control includes both air-mixing elements and active cooling capability via cooling units 202.

Fluid communication is possible between air-handling and mixing unit 204 and primary structure 201 via an aperture 220b formed when an opening in top 228 of primary structure 201 aligns with a corresponding opening in the bottom of air-handling and mixing unit 204. Similarly, fluid communication is possible between air-handling and mixing unit 204 and cooling unit 202 via an aperture 220a formed when an opening in the top of cooling unit 202 aligns with a corresponding opening in the bottom of air-handling and mixing unit 204.

Each exhaust duct 224 may be mechanically mounted to air-handling and mixing unit 204 proximate to a corresponding damper 210d, such that air flowing through such damper 210d is directed substantially vertically upward from modular data center 200, thus preventing re-entrainment of exhausted air into modular data center 200, adjacent modular data centers 200, and/or other adjacent structures. Also, as described in greater detail below with respect to FIG. 4, each exhaust duct 224 may be configured to prevent fluid, debris, and/or animals from collecting in the exhaust duct 224 or other components of air-handling and mixing unit 204.

Fluid interfaces between the fluid-handling system of modular data center 200 and the environment external to modular data center 200 (e.g., the fluid interfaces at dampers 210a, 210b, and/or 210d) may include one or more protection elements allowing modular data center 200 to operate outdoors, exposed to environmental elements and animals. These protection elements may include, but are not limited to, storm louvers, bird screens, filtration elements (e.g., filters 212), and dampers (e.g., dampers 210).

Figure 3A:
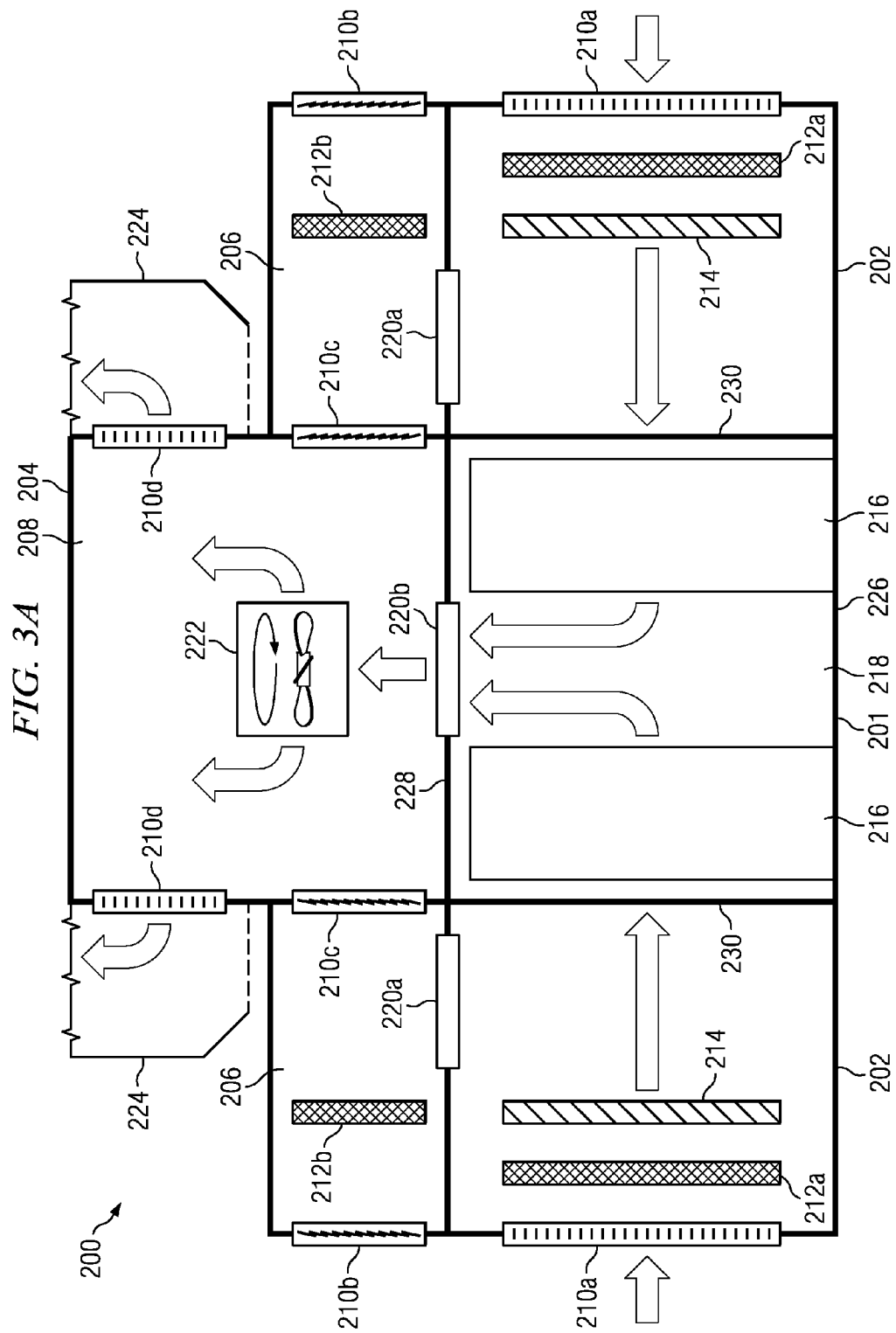
FIG. 3A illustrates the modular data center of FIG. 2 operating in a first mode, in accordance with embodiments of the present disclosure.
Figure 3B:
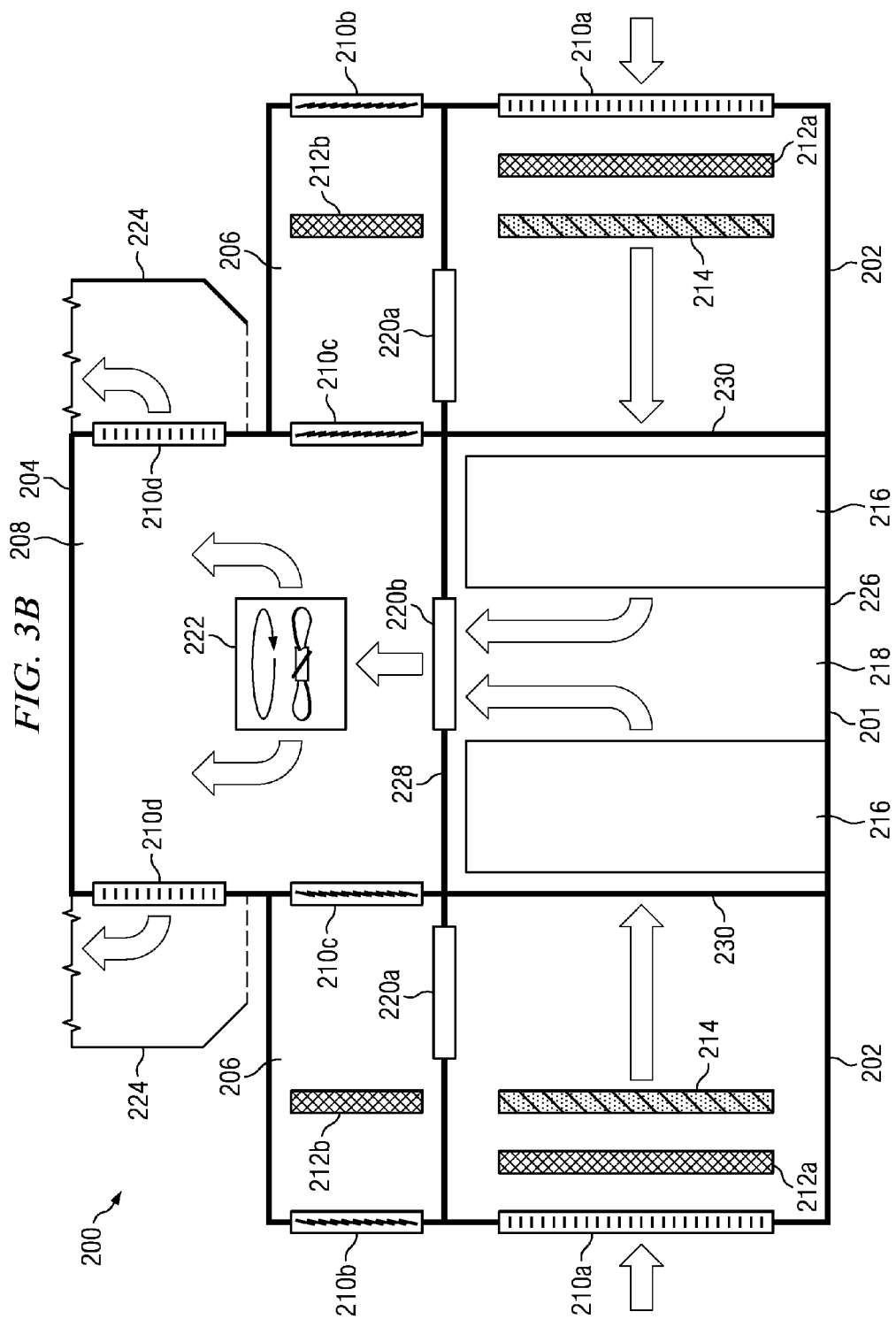
FIG. 3B illustrates the modular data center of FIG. 2 operating in a second mode, in accordance with embodiments of the present disclosure.

As described below with respect to FIGS. 3A-3C, modular data center 200 may provide a plurality of modes through the modulation of dampers 210, wherein the selection of a mode may be based on ambient environmental conditions and/or other factors (e.g., temperature, humidity, air quality, etc.). In some embodiments, the modular fluid-handling system of modular data center 200 may be automated. For example, the modular fluid-handling system may include a plurality of sensors within or outside of modular data center 200. These sensors may electronically read air temperature, humidity, air quality, and/or other relevant parameters and communicate such readings to an information handling system. Depending on the environmental readings, the information handling system may electronically and in an automatic fashion cause particular dampers 210 within the modular fluid-handling system to be modulated. Dampers 210 may be modulated using any of a numbers of systems well known in the art (e.g., electronic motors). In some embodiments, programmable logic on an information handling system may be used to control dampers 210 as well as air mover 222, heat-rejecting media 214, and/or other components of the modular fluid-handling system.

The modular fluid-handling system incorporated into modular data center 200 may include at least three modes. A first mode may be used when environmental conditions are moderate (e.g., outside air is neither "too hot" or "too cold"). In this first mode, as illustrated in FIG. 3A, dampers 210b and 210c are closed (as indicated in FIG. 3A), dampers 210a and 210d are open (as indicated in FIG. 3A), and heat-rejection media 214 is disabled (e.g., turned "off"). In this mode, air mover 222 may pull air from aisle 218 of primary structure 201 into air-handling and mixing unit 204. To equalize air pressure within aisle 218, air flows from the outside environment through dampers 210a, through filters 212a, and by disabled heat-rejection media 214 before passing through racks 216 and into aisle 201, thus cooling information handling resources disposed in racks 216. From aisle 218, air may then be pulled by air mover 222 into air mover plenum 208, and then exhausted to the outside environment through dampers 210d.

A second mode may be used in conditions in which the outside air is too hot to be used as is. In this second mode, as illustrated in FIG. 3B, dampers 210b and 210c are closed (as indicated in FIG. 3B), dampers 210a and 210d are open (as indicated in FIG. 3B), and heat-rejection media 214 is enabled (e.g., turned "on"). In this mode, air mover 222 may pull air from aisle 218 of primary structure 201 into air-handling and mixing unit 204. To equalize air pressure within aisle 218, air flows from the outside environment through dampers 210a, through filters 212a, and by heat-rejection media 214 where the outside air is cooled before passing through racks 216 and into aisle 201, thus cooling information handling resources disposed in racks 216. From aisle 218, air may then be pulled by air mover 222 into air mover plenum 208, and then exhausted to the outside environment through dampers 210d. As can be seen by comparing FIGS. 3A and 3B, the second cooling mode includes an airflow pattern very similar to that of the first mode. The difference is that the heat-rejection media 214 is enabled in the second mode in order to cool the outside air before or as it enters modular data center 200, as the outside air is too hot.

A third mode may be used in conditions in which the outside air is too cold and/or too humid to be used as is. In this third mode, as illustrated in FIG. 3C, dampers 210b, 210c, and 210d are open (as indicated in FIG. 3C), dampers 210a are closed (as indicated in FIG. 3C), and heat-rejection media 214 is disabled (e.g., turned "off"). In this mode, air mover 222 may pull air from aisle 218 of primary structure 201 into air-handling and mixing unit 204. To equalize air pressure within aisle 218, air flows from mixing plenums 206 via cooling units 202 into aisle 218, thus cooling information handling resources disposed in racks 216. From aisle 218, air may then be pulled by air mover 222 into air mover plenum 208. Dampers 210c and 210d may be modulated to control the amount of air exhausting from air mover plenum 208 to the outside environment (via dampers 210d) and the amount of air communicated from air mover plenum 208 to mixing plenums 206. Air enters each respective mixing plenum 206 from the outside via a corresponding damper 210b and from air mover plenum 208 via a corresponding damper 210c where such air is mixed together. Because the outside air is too cold, and the air from air mover plenum 208 is warmer than the outside air by virtue of passing by and cooling information handling resources in racks 216, air may be mixed in mixing plenum 206 to a temperature that is within a predetermined temperature. For example, if the air is too cold or too warm, dampers 210b, 210c, and 210d may be modulated to control the amount of air entering mixing plenum 206 from either air mover plenum 208 or the outside, thereby controlling the temperature of the resultant air.

Figure 4:
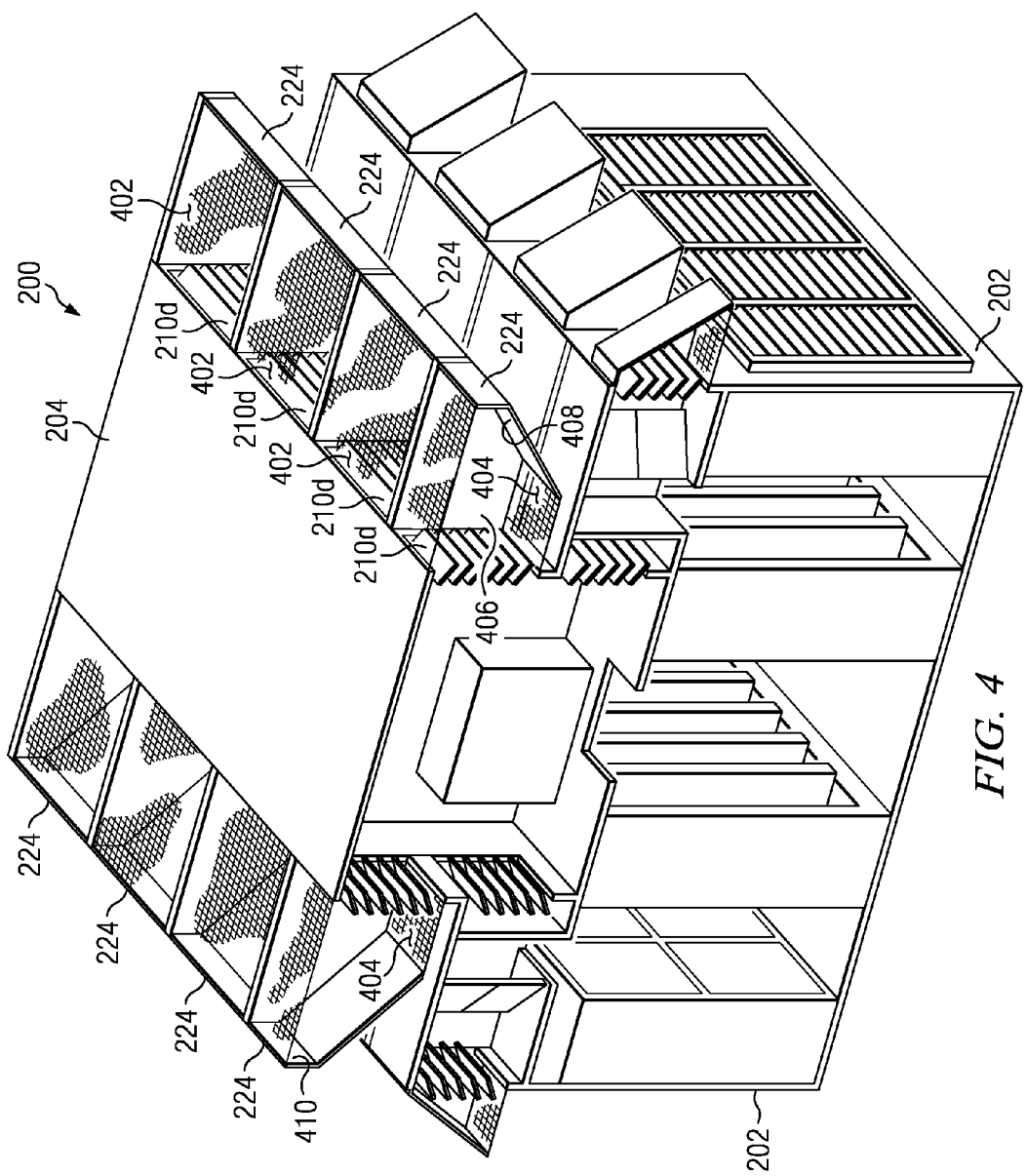
FIG. 4 illustrates a perspective cross section view of the modular data center of FIG. 2, in accordance with embodiments of the present disclosure.

FIG. 4 illustrates a perspective cross section view of the modular data center of FIG. 2, in accordance with embodiments of the present disclosure. As explained above, each exhaust duct 224 may be mechanically mounted to air-handling and mixing unit 204 proximate to a corresponding damper 210d, such that air flowing through such damper 210d is directed substantially vertically upward from modular data center 200, thus preventing re-entrainment of exhausted air into modular data center 200, adjacent modular data centers 200, and/or other adjacent structures. Also, as explained above, each exhaust duct 224 may be configured to prevent fluid, debris, and/or animals from collecting in the exhaust duct 224 or other components of air-handling and mixing unit 204. To that end, each exhaust duct 224 may include a top 402, a bottom 404, two opposing vertical sides 406, a sloping side 408, and front side 410. Each of top 402 and bottom 404 may comprise, in whole or part, a screen configured to permit passage of fluid (e.g., air and/or liquid) and solids below a particular size while preventing passage of solids larger than a particular size (e.g., animals and/or other undesirable debris). As shown in FIG. 4, top 402 and bottom 404 may each generally have the shape of a rectangle, and top 402 and bottom 404 be oriented opposite from and substantially parallel to each other, may share a common dimension (e.g., width), and have an uncommon dimension (e.g., length).

Each vertical side 406 may generally have the shape of a pentagon having three consecutive right angles and two consecutive obtuse angles. Each vertical side 406 may be primarily solid and constructed from any suitable material (e.g., stainless steel). An exhaust duct 224 may be configured such that a first edge of each vertical side 406 between a first right angle and a second right angle of such vertical side 406 is coupled to an edge of top 402 and a second edge of each vertical side 406 substantially parallel to the first edge of a third right angle and a first obtuse angle of such vertical side 406 is coupled to an edge of bottom 404. As so coupled, vertical sides 406 may be opposite from, substantially parallel to, and sized substantially similar to each other, and may also be substantially perpendicular to each of top 402 and bottom 404.

Sloping side 408 may be primarily solid and constructed from any suitable material (e.g., stainless steel). As shown in FIG. 4, sloping side 408 may generally have the shape of a rectangle. An exhaust duct 224 may be constructed such that sloping side 408 is coupled at a first edge to an edge of bottom 404, at a second edge to the edge between the obtuse angles of a first vertical side 406, and at a third edge (opposite the second edge) to the edge between the obtuse angles of a second vertical side 406. Sloping side 408 may be coupled at a fourth edge (opposite the first edge) to an edge of front side 410. Sloping side 408 may be oriented substantially perpendicular to each of vertical sides 406 and substantially non-perpendicular and substantially non-parallel to each of top 402 and bottom 404.

If present, front side 410 may be primarily solid and constructed from any suitable material (e.g., stainless steel). As shown in FIG. 4, front side 410 may generally have the shape of a rectangle. Exhaust duct 224 may be constructed such that a first edge of front side 410 is coupled to an edge of sloping side 408 opposite to the edge of sloping side 408 coupled to bottom 404, a second edge of front side 410 is coupled between an obtuse angle and a right angle of a first vertical side 406, and a third edge of front side 410 is coupled between an obtuse angle and a right angle of a second vertical side 406, such that front side 410 is substantially perpendicular to each of top 402, bottom 404, and vertical sides 406.

In some embodiments, exhaust duct 224 may not include front side 410, in which case each vertical side 406 may have the shape of a quadrilateral and top 402 may be coupled along an edge to sloping side 408.

As constructed, exhaust duct 224 may have a rectangular-shaped open face defined by and perpendicular to each of top 402, bottom 404, and vertical sides 406. Such open face may be coupled to air-handling and mixing unit 204 proximate to a respective damper 210d such that top 402 and bottom 404 are substantially parallel to base 226 of primary structure 201. In operation, the configuration of exhaust duct 224 may upwardly direct horizontally-exhausted air from air-handling and mixing unit 204, thus preventing re-entrainment of exhausted air into modular data center 200, adjacent modular data centers 200, and/or other adjacent structures. Screened opening of top 402 may allow exhaust air to travel through while preventing animals and/or other unwanted debris from entering modular data center 402 and screened opening of bottom 404 may allow precipitation falling into exhaust duct through top 402 to drain through while preventing such precipitation as well as animals and/or other unwanted debris from entering modular data center 402

The above-enumerated equipment and components of modular data center 200 is not intended to be an exhaustive list, and each of the modules above may include other equipment that is well known in the art to be part of a modular data center and/or the individual modules thereof.

Although the symmetric arrangement depicted in the FIGURES may be beneficial for reasons described above, in some embodiments some elements of modular data center 200 may not be present. For example, in some embodiments, the left-most mixing plenum 206, cooling unit 202, and racks 216 may not be present.

Although the disclosure has described the movement of air through a modular data center, a modular fluid-handling system should not be seen as limited to the movement of air through a data center. Instead, as will be appreciated by one of ordinary skill in the art in view of this disclosure, any number of fluids may be moved and handled within the scope of this disclosure. For example, a modular fluid-handling system may also include the movement of refrigerant, water, or any other suitable fluid. Additionally, a modular fluid-handling system should not be seen as limited to cooling a modular data center. Instead, a modular fluid-handling system may be used to cool, heat, move air, condition air, move water or other fluids, etc.

Although the present disclosure has been described in detail, it should be understood that various changes, substitutions, and alterations can be made hereto without departing from the spirit and the scope of the disclosure as defined by the appended claims.

What is claimed is:
1. A modular fluid-handling system comprising:
   a fluid-handling unit configured to exhaust air, from an exhaust source, flowing in a substantially horizontal direction; and
   an exhaust duct coupled to and in fluid communication with the fluid-handling unit and configured to redirect air flowing in the substantially horizontal direction from the exhaust source in a substantially vertical direction, the exhaust duct comprising:
a screened top including a first screen;
a screened bottom substantially parallel to and opposite from the top, the bottom including a second screen, wherein the first screen and the second screen pass liquid and air therethrough and prevent passage therethrough of solids larger than a minimum size;
a solid first vertical side substantially perpendicular to the top, the first vertical side coupled along a first edge of the first vertical side to a first edge of the top and coupled along a second edge of the first vertical side to a first edge of the bottom;
a solid second vertical side substantially parallel to and opposite from the first vertical side, the second vertical side coupled along a first edge of the second vertical side to a second edge of the top and coupled along a second edge of the second vertical side to a second edge of the bottom; and
a solid sloping side substantially perpendicular to the first vertical side and substantially non-perpendicular and non-parallel to the top, the sloping side coupled along a first edge of the sloping side to a third edge of the first vertical side, coupled along a second edge of the sloping side to a third edge of the second vertical side, and coupled along a third edge of the sloping side to a third edge of the bottom.

2. The modular fluid-handling system of claim 1, the exhaust duct further comprising a front side substantially perpendicular to the top and the first vertical side, the front side coupled along a first edge of the front side to a fourth edge of the sloping side, coupled along a second edge of the front side to a fourth edge of the first vertical side, coupled along a third edge of the front side to a fourth edge of the first vertical side, and coupled along a fourth edge of the front side to a third edge of the top.

3. The modular fluid-handling system of claim 1, wherein the sloping side is coupled at a fourth edge of the sloping side to a third edge of the top.

4. The modular fluid-handling system of claim 1, wherein:
the top and the bottom are of substantially equal width; and
the top is of greater length than the bottom.

5. The modular fluid-handling system of claim 1, wherein at least one of the top and the bottom are rectangular in shape.

6. The modular fluid-handling system of claim 1, wherein the first vertical side and the second vertical side are of substantially equal dimensions.

7. The modular fluid-handling system of claim 1, wherein the top, the bottom, the first vertical side, and the second vertical side define an open face.

8. The modular fluid-handling system of claim 7, the exhaust duct configured to be coupled via the open face to the exhaust source of the fluid-handling unit.

9. The modular fluid-handling system of claim 1, wherein the first vertical side, the second vertical side, and the sloping side are stainless steel sides.

10. The modular fluid-handling system of claim 1, wherein the minimize size prevents passage therethrough by an animal.

11. The modular fluid-handling system of claim 1, wherein the minimize size prevents passage therethrough by a bird.

* * * * *